United States Patent
Wang et al.

(10) Patent No.: US 7,199,390 B2
(45) Date of Patent: Apr. 3, 2007

(54) WINDOW INTERFACE LAYER OF A LIGHT-EMITTING DIODE

(75) Inventors: Pei-Jih Wang, Dashi (TW); Rupert Wu, Dashi (TW)

(73) Assignee: Arima Optoelectronics Corp., Taoyuan County (TW)

( * ) Notice: Subject to any disclaimer, the term of this patent is extended or adjusted under 35 U.S.C. 154(b) by 0 days.

(21) Appl. No.: 11/500,330

(22) Filed: Aug. 8, 2006

(65) Prior Publication Data

US 2007/0045608 A1    Mar. 1, 2007

(30) Foreign Application Priority Data

Aug. 26, 2005   (TW)   .............................. 94129196 A

(51) Int. Cl.
*H01L 29/06*    (2006.01)
*H01L 31/072*   (2006.01)
*H01L 31/109*   (2006.01)
*H01L 31/0328*  (2006.01)
*H01L 31/0336*  (2006.01)

(52) U.S. Cl. ............................. 257/14; 257/13; 372/42
(58) Field of Classification Search ................ 257/13, 257/14, 79, 94, 99, 103; 372/42
See application file for complete search history.

(56) References Cited

U.S. PATENT DOCUMENTS 5,045,894 A * 9/1991 Migita et al. .................. 257/94
6,995,401 B2 * 2/2006 Yamada et al. ............... 257/79

* cited by examiner

Primary Examiner—Phuc T. Dang
(74) Attorney, Agent, or Firm—Rosenberg, Klein & Lee

(57) ABSTRACT

This invention is about a window interface layer in a light-emitting diode which comprises an n-type GaAs substrate with an n-type ohmic electrode at the bottom side thereof; an n-type AlGaInP cladding layer formed atop the substrate; an undoped AlGaInP active layer formed atop the n-type cladding layer; a p-AlGaInP cladding layer formed atop the active layer; a p-type window layer made of GaP; a p-type ohmic electrode formed atop the p-type window layer; and a highly doped p-type interface layer made of $Ga_xIn_{1-x}P$ ($0.6 \leq x \leq 0.9$) and interposed between the p-type cladding layer and p-type window layer wherein the highly doped p-GaInP interface layer possesses a band gap which is higher than that of the active layer and, however, smaller than that of the p-type cladding layer, and wherein the lattice constant lies between GaAs and GaP. In this way, the p-GaInP interface layer is interposed between a p-GaP window layer and a p-AlGaInP cladding layer for enhancing the film quality and the luminous efficiency as well as improving the electric property.

5 Claims, 3 Drawing Sheets

WINDOW INTERFACE LAYER OF A LIGHT-EMITTING DIODE

BACKGROUND OF THE INVENTION

1. Field of the Invention

The invention relates to a window interface layer of a light-emitting diode, and more particularly to a p-GaInP interface layer interposed between a p-GaP window layer and a p-AlGaInP layer for enhancing the film quality and the luminous efficiency as well as improving the electric property.

2. Description of the Related Art

With the rapid development of the Metal-Organic Chemical Vapor Deposition (MOCVD), the MOCVD process has been widely applied to the production of AlGaInP material with excellent crystallization. Accordingly, it is suitable for the mass production of light-emitting diodes with high luminance.

The conventional AlGaInP light-emitting diode is formed on an n-type GaAs substrate with a double heterostructure (DH). The double heterostructure includes a p-AlGaInP and an n-type AlGaInP cladding layer at a top and a bottom side while a luminous active layer is interposed between the cladding layers. In order to obtain a high luminous efficiency, the current spreading in the p-layer plays a very important role.

In order to ensure the current spreading for a high quality AlGaInP light-emitting diode, a thick window layer is provided atop the light-emitting diode. This material has to be transparent with respect to the wavelength of emitted light. Meanwhile, it possesses a high hole mobility and a high concentration of carrier density. The transparency depends on the wavelength and the window layer material. For this purpose, AlGaAs and GaP are two of the most frequently employed materials. The reason of using the AlGaAs is because the p-AlGaAs can be doped with an extremely high impurities while the hole mobility can be still maintained at a high level. Meanwhile, AlGaAs can be easily deposited on the GaAs substrate by use of the MOCVD process.

In addition, GaP is also an excellent choice. The p-GaP can also be doped with a high concentration of p-impurities. Meanwhile, it is transparent to red, yellow and green light. However, GaP and GaAs have a lattice mismatch of 3.6%.

Recently, a few of improved structures and techniques have been disclosed for enhancing the efficiency of light-emitting diodes. As shown in FIG. 1, a light-emitting diode employed by Hewlett-Packard (HP) includes a thick GaP window layer for the purpose of better current spreading and light extraction. The structure in FIG. 2 is disclosed by Toshiba and employs p-AlGaAs as window layer. Meanwhile, a current-blocking layer and a distributed Bragg reflector layer are added thereto. The structure shown in FIG. 3 employs indium-tin oxide (ITO) as current spreading layer. Besides, a distributed Bragg reflector layer is also applied thereto.

However, the use of the material of GaAsP or GaP in the window layer results in lattice mismatch with the substrate, thereby affecting the operational life time of the components. Moreover, the window layer made of ITO, SnO, InO, or the like has a transparency approaching to 90% in the range of visible light. Meanwhile, it has a resistivity of about $3 \times 10^{-4}$ Ω-cm, approximately one percent of the resistivity of p-type GaP. However, the light emitted from the side of the die can't be effectively utilized in the case of an optimal thickness ranging from 0.1 to 5 μm, thereby limiting the luminous efficiency of the light-emitting diodes.

In order to resolve the problem of poor reliability, U.S. Pat. No. 5,359,209 teaches a twin window layer structure shown in FIG. 4. The window layer contains a first window layer made of GaAs with the band gap smaller than that of the active layer and a second window layer made of GaP with the band gap higher than that of the active layer. This structure can stabilize dislocation defects the forward voltage $V_f$ due to the defects at the interface. However, the window layer absorbs light due to the fact that GaAs used in the window layer has a band gap less than the active layer. Accordingly, the LED's brightness is much affected. Thus, the twin window layer consisting of GaAs and GaP disclosed in U.S. Pat. No. 5,359,209 still leaves some room for improvement.

SUMMARY OF THE INVENTION

A primary object of the invention is to provide a window interface layer of a light-emitting diode that employs a p-GaInP interface layer interposed between a p-GaP window layer and a p-AlGaInP cladding layer to reduce the dislocation defects, thereby improving the film quality of the window layer and enhancing the luminous intensity as well as having an excellent forward voltage $V_f$.

Another object of the invention is to provide a window interface layer of a light-emitting diode in which the p-GaInP interface layer can be continuously formed by using the MOCVD process after the AlGaInP layers are deposited one after another. Meanwhile, a p-GaP window layer can also be continuously deposited by use of the MOCVD process after the interface layer is grown. In this way, the interface layer and the window layer are formed in the same state except the growth temperature, thereby simplifying the manufacturing process.

In order to achieve the above-mentioned objects, a window interface layer of a light-emitting diode comprises:

a) an n-type GaAs substrate having an n-type type ohmic electrode at a bottom side thereof;

b) an n-type AlGaInP cladding layer formed atop the substrate;

c) an undoped AlGaInP active layer formed atop the n-type cladding layer;

d) a p-AlGaInP cladding layer formed atop the active layer;

e) a p-type window layer made of GaP;

f) a p-type ohmic electrode formed atop the p-type window layer; and g) a highly doped p-type interface layer made of $Ga_xIn_{1-x}P$ ($0.6 \leq x \leq 0.9$) and interposed between the p-type cladding layer and p-type window layer wherein the highly doped p-GaInP interface layer has a band gap which is higher than that of the active layer and, however, smaller than that of the p-type cladding layer, and wherein the lattice constant lies between GaAs and GaP.

BRIEF DESCRIPTION OF THE FIG.S

The accomplishment of this and other objects of the invention will become apparent from the following descriptions and its accompanying figures of which:

DETAILED DESCRIPTION OF THE PREFERRED EMBODIMENT

Figure 1:
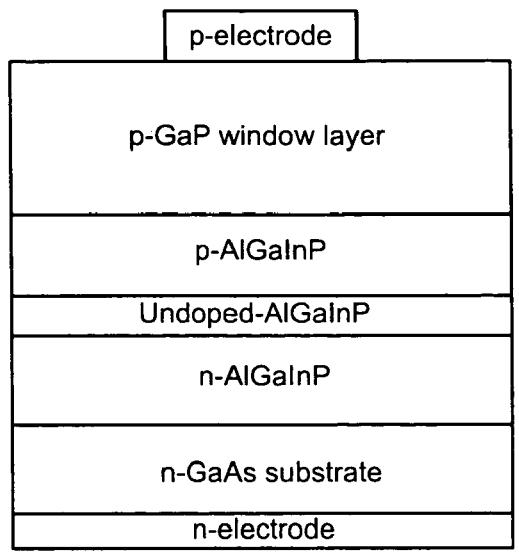
FIG. 1 is a cross-section of the first conventional light-emitting diode.
Figure 2:
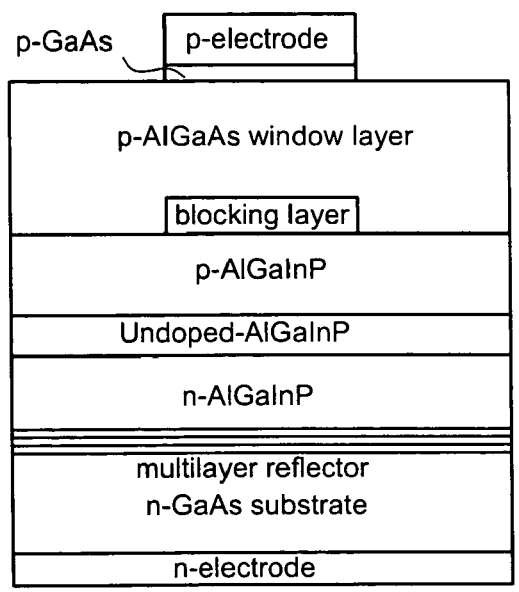
FIG. 2 is a cross-section of the second conventional light-emitting diode.
Figure 3:
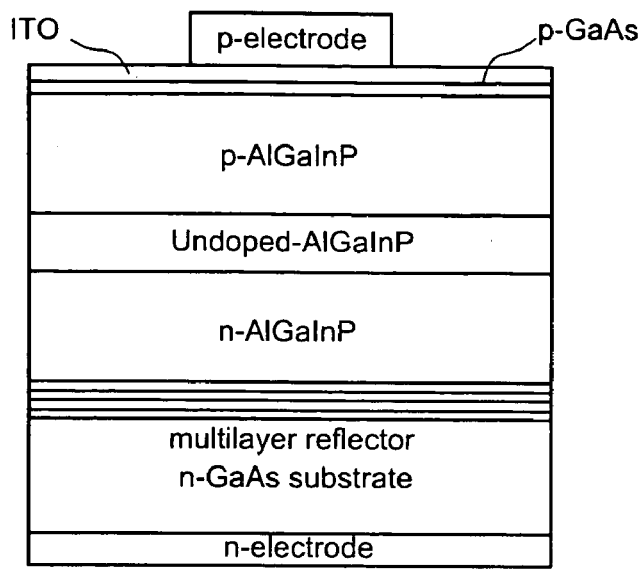
FIG. 3 is a cross-section of the third conventional light-emitting diode.
Figure 4:
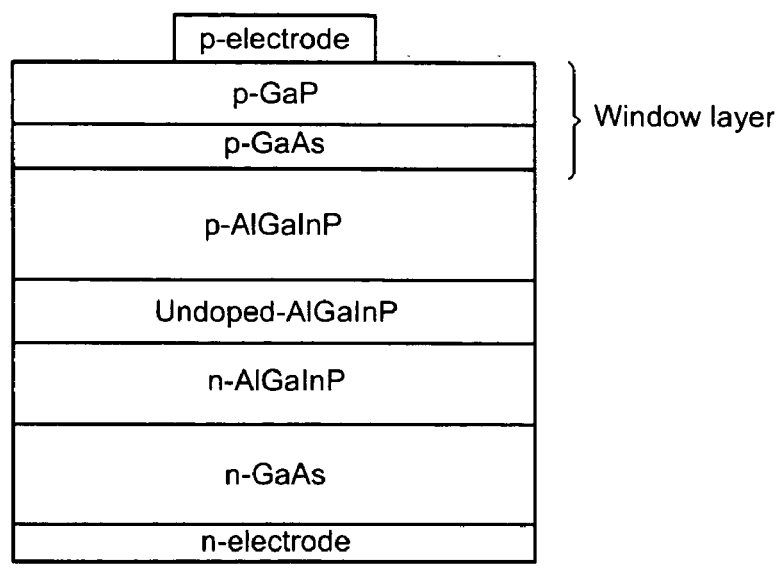
FIG. 4 is a cross-section of the fourth conventional light-emitting diode.
Figure 5:
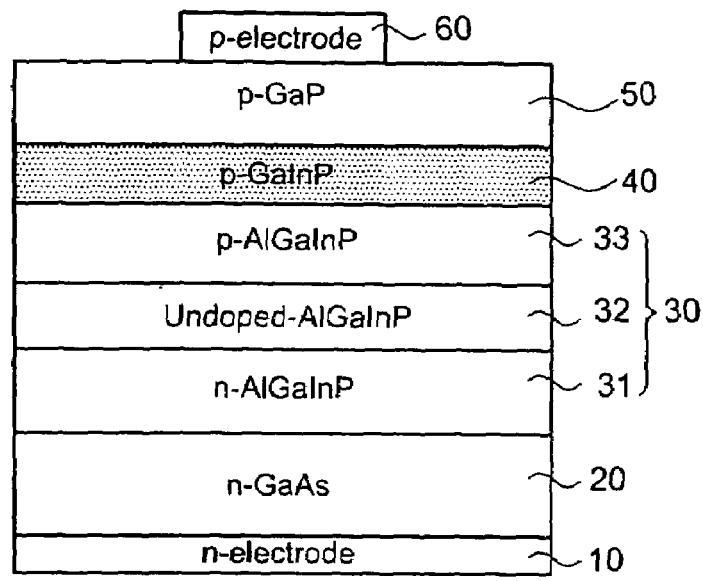
FIG. 5 is a cross-section of a preferred embodiment of the invention.

First of all, referring to FIG. 5, a substrate 20 in accordance with the invention is made of n-type GaAs or the like. An AlGaInP double hetero structure 30 lies on the topside of the n-type GaAs substrate 20. The AlGaInP double hetero structure 30 consists of an n-type AlGaInP cladding layer 31 formed atop the n-type GaAs substrate 20, an undoped AlGaInP active layer 32 atop the cladding layer 31, and a p-AlGaInP cladding layer 33 atop the active layer 32. The aforementioned three layers are deposited one after another by use of the Metal-Organic Chemical Vapor Deposition (MOCVD) process. In accordance with the invention, the undoped AlGaInP active layer 32 constitutes an AlGaInP multi-quantum well (MQW).

A highly doped p-type interface layer 40 is made of $Ga_xIn_{1-x}P$ ($0.6 \leq x \leq 0.9$) and formed atop the p-AlGaInP cladding layer 33. Thereafter, a p-type window layer 50 made of p-GaP is formed atop the interface layer 40. The deposition of the interface layer 40 is adapted to reduce the dislocation defects between the p-AlGaInP cladding layer 33 and the p-GaP window layer 50. The interface layer 40 will be continuously formed in the same MOCVD process after the three layers of the AlGaInP double hetero structure 30 are deposited. After the interface layer 40 is grown, the p-GaP window layer 50 will be continuously formed in the same MOCVD epi process. In this way, the interface layer 40 and the p-GaP window layer 50 are deposited in the same state except the growth temperature.

The preferable thickness of the interface layer 40 ranges from 0.01 to 0.6 μm while the total thickness of the p-GaP window layer 50 and the highly doped p-type interface layer 40 amounts to about 5~15 μm. The highly doped p-GaInP interface layer 40 has a doping concentration of $5\times10^{17} \sim 10^{20}$ cm$^{-3}$, and has a band gap which is higher than that of the active layer 32 and, however, smaller than that of the p-type cladding layer 33. An n-type electrode 10 is deposited on the bottom side of the n-type GaAs substrate 20. Thereafter, a p-type electrode 60 is deposited atop the p-type window layer 50.

The invention is primarily characterized in that the p-GaInP interface layer 40 has a lower band gap than the p-AlGaInP cladding layer 33. By inserting the p-type interface layer 40 with band gap smaller than that of the active layer 32, the light emitted by the active layer 32 will be absorbed by the interface layer 40, thereby lowering the luminous efficiency of the light-emitting diode. Therefore, it's preferable that the band gap of the interface layer 40 has to be smaller than that of the p-AlGaInP cladding layer 33, and, however, higher than that of the active layer 32. Meanwhile, the lattice constant lies between the GaAs and GaP.

Based on the aforementioned structure, the light-emitting diode in accordance with the invention will be described in more detail as follows. When the n-type electrode 10 and the p-type electrode 60 are fed with electric current, the electric current is spreaded to the edge of the light-emitting diode and evenly flows through the p-n junction due to the fact that the GaP window layer 50 has a high conductivity. The GaInP interface layer 40 between the window layer 50 and the p-AlGaInP cladding layer 33 ensures a considerable reduction of the density of dislocation defects at the interface. Moreover, GaInP is more transparent than GaAs, thereby improving the film quality of the window layer 50 and, therefore, enhancing the luminous intensity. Meanwhile, an excellent forward voltage $V_f$ is guaranteed as well.

Figure 6:
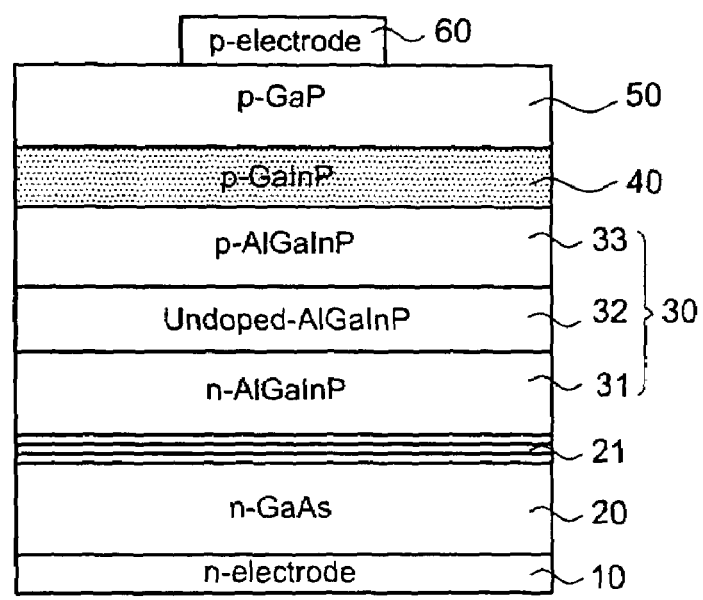
FIG. 6 is a cross-section of another embodiment of the invention.

FIG. 6 illustrates another preferred embodiment of the invention. The layers identical to that in FIG. 5 are marked with the same number. An n-type distributed Bragg reflector layer 21 is deposited atop the substrate 20. Then, an n-type AlGaInP cladding layer 31 is formed atop the n-type distributed Bragg reflector layer 21 while an undoped AlGaInP active layer 32 lies on the n-type AlGaInP cladding layer 31. Thereafter, a p-AlGaInP cladding layer 33 is arranged on the top side of the active layer 32 while a p-type interface layer 40 is formed atop the p-AlGaInP cladding layer 33. Subsequently, a GaP window layer 50 is developed on the top side of the p-type interface layer 40. In addition, the n-type ohmic electrode 10 is deposited at the bottom side of the substrate 20 while a p-type ohmic electrode 60 lies on the top side of the GaP window layer 50.

The above-mentioned n-type distributed Bragg reflector layer 21 is made of $Al_xGa_{1-x}As/Al_yGa_{1-y}As$, where $0 \leq x \leq 1$; $0 \leq y \leq 1$; $x \neq y$.

The thickness of the n-type GaAs substrate 20 ranges from 100 μm to 300 μm in accordance with the above-mentioned embodiments of the invention. The n-type cladding layer 31 is made of $(Al_xGa_{1-x})_{0.5}In_{0.5}P$ ($0.5 \leq x \leq 1$) having a doping concentration of $5\times10^{17} \sim 10^{20}$ cm$^{-3}$ and possessing a thickness from 0.3 μm to 2 μm. The active layer 32 is made of undoped $(Al_xGa_{1-x})_{0.5}In_{0.5}P$ ($0 \leq x \leq 0.4$), thereby forming a single layer structure. Alternatively, it can be constructed as a multi-quantum well (MQW) structure having a thickness smaller than 3 μm and made of $(Al_xGa_{1-x})_{1-y}In_yP/(Al_{x1}Ga_{1-x1})_{y1}P$ ($0.5 \leq x \leq 1$, $0.4 \leq y \leq 0.6$ and $0 \leq x1 \leq 0.5$, $0.4 \leq y1 \leq 0.6$). The p-AlGaInP cladding layer 33 is composed of $(Al_xGa_{1-x})_{0.5}In_{0.5}P$ ($0.5 \leq x \leq 1$) having a doping concentration of $5\times10^{16} \sim 10^{18}$ cm$^{-3}$ and possessing a thickness from 0.3 μm to 2 μm.

The following table shows a comparison of the luminance and the forward voltage ($V_f$) between the light-emitting diode having the GaInP interface layer 40 and the conventional light-emitting diode under the testing conditions of 20 mA direct current and room temperature.

| Item | Function | |
|---|---|---|
| | Luminance | Forward Voltage (Vf) |
| LED of the invention | 60~67 mcd | 1.8~2.3 V |
| Conventional LED | 30~40 mcd | 2.0~3 V |
| Conventional GaAs + GaP with twin window layers | 50~60 mcd | 1.8~2.3 V |

Based on the above-mentioned description, the GaP window layer 50 in accordance with the invention is formed on top of the GaInP interface layer 40 atop AlGaInP cladding layer 33 without affecting the efficiency and reliability of the light-emitting components, thereby enhancing the luminance and improving the operational voltage ($V_f$).

Many changes and modifications in the above-described embodiments of the invention can, of course, be carried out without departing from the scope thereof. Accordingly, to promote the progress in science and the useful arts, the invention is disclosed and not intended being limited only by the scope of the appended claims.

What is claimed is:

1. A window interface layer of a light-emitting diode, comprising:
   a) an n-type GaAs substrate having an n-type ohmic electrode at the bottom side thereof;
   b) an n-type AlGaInP cladding layer formed atop the substrate;
   c) an undoped AlGaInP active layer formed atop the n-type cladding layer;
   d) a p-AlGaInP cladding layer formed atop the active layer;
   e) a p-type window layer made of GaP;
   f) a p-type ohmic electrode formed atop the p-type window layer; and
   g) a highly doped p-type interface layer made of $Ga_xIn_{1-x}P$ ($0.6 \leq x \leq 0.9$) and interposed between the p-type cladding layer and the p-type window layer wherein the highly doped p-GaInP interface layer possesses a band gap which is higher than that of the active layer and, however, smaller than that of the p-type cladding layer, and wherein its lattice constant lies between GaAs and GaP.

2. The window interface layer of a light-emitting diode as recited in claim 1 wherein the highly doped p-GaInP interface layer has a doping concentration ranging from $5 \times 10^{17}$ to $10^{20}$ $cm^{-3}$.

3. The window interface layer of a light-emitting diode as recited in claim 1 wherein the highly doped p-GaInP interface layer possesses a thickness ranging from 0.01 to 0.6 µm.

4. The window interface layer of a light-emitting diode as recited in claim 1 wherein the undoped AlGaInP active layer includes a multi-quantum well (MQW) structure.

5. The window interface layer of a light-emitting diode as recited in claim 1 wherein a distributed Bragg reflector layer is interposed between the substrate and the n-type AlGaInP cladding layer.

* * * * *